US006717539B2

(12) United States Patent
Fischer et al.

(10) Patent No.: US 6,717,539 B2
(45) Date of Patent: Apr. 6, 2004

(54) DIGITAL-TO-ANALOG CONVERTER

(75) Inventors: Jonathan Herman Fischer, Longmont, CO (US); Donald Raymond Laturell, Allentown, PA (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 09/996,209

(22) Filed: Nov. 28, 2001

(65) Prior Publication Data

US 2003/0098807 A1 May 29, 2003

(51) Int. Cl.[7] .............................................. H03M 1/66
(52) U.S. Cl. ...................................... 341/144; 341/141
(58) Field of Search ................................ 341/144, 118, 341/141; 345/100; 360/46; 363/16

(56) References Cited

U.S. PATENT DOCUMENTS

| | | | | |
|---|---|---|---|---|
| 4,430,642 A | * | 2/1984 | Weigand et al. | 341/120 |
| 4,535,371 A | * | 8/1985 | Harr et al. | 360/46 |
| 5,055,844 A | * | 10/1991 | Kasai | 341/118 |
| 5,221,926 A | * | 6/1993 | Jackson | 341/118 |
| 5,243,347 A | * | 9/1993 | Jackson et al. | 341/144 |
| 5,294,929 A | * | 3/1994 | Numata et al. | 341/141 |
| 5,321,401 A | * | 6/1994 | White | 341/144 |
| 5,793,320 A | * | 8/1998 | Keum et al. | 341/144 |
| 5,946,206 A | * | 8/1999 | Shimizu et al. | 363/16 |
| 5,952,948 A | * | 9/1999 | Proebsting | 341/144 |
| 6,222,473 B1 | * | 4/2001 | Castaneda et al. | 341/144 |
| 6,304,241 B1 | * | 10/2001 | Udo et al. | 345/100 |

OTHER PUBLICATIONS

Carley, L. Richard, "A Noise–Shaping Coder Topology for 15+ Bit Converters," *IEEE J. Solid–State Circuits*, vol. SC–24, pp. 267–273, Apr. 1989.

Roettcher, Ulrich et al., "A Compatible CMOS–JFET Pulse Density Modulator for Interpolative High–Resolution A/D Conversion," *IEEE J. Solid–State Circuits*, vol. SC–21, pp. 446–452, Jun. 1986.

Van der Plas, Geert A. M. et al., "A 14–bit Intrinsic Accuracy $Q^2$ Random Walk CMOS DAC," *IEEE J. Solid–State Circuits*, vol. 34, No. 12, pp. 1708–1718, Dec. 1999.

* cited by examiner

*Primary Examiner*—Jean Jeanglaude
(74) *Attorney, Agent, or Firm*—Harness, Dickey & Pierce, P.L.C.

(57) ABSTRACT

The digital-to-analog converter includes an output line, and a plurality of converters receiving control signals representative of digital data. Each converter selectively connects the output line to a voltage in response to a respective one of the control signals. Optionally, the digital-to-analog converter further includes a reset circuit for resetting the voltage on the output line to a reset voltage between portions of the analog waveform representing a digital data symbol.

23 Claims, 5 Drawing Sheets

16
NOISE SHAPER
10
6
RANDOMIZER
12
6
BINARY TO THERMOMETER ENCODER
14
64
INVERSE CORRECTION FUNCTION UNIT
15
64
POWER DAC WITH RETURN TO ZERO CIRCUIT
16

DIGITAL-TO-ANALOG CONVERTER

BACKGROUND OF THE INVENTION

1. Field of the Invention

The present invention relates to digital-to-analog converters; and more specifically, high output power digital-to-analog converters.

2. Description of Related Art

Conventional digital-to-analog converters DACs, such as for an ADSL modem, cannot drive the desired load. As a result, designers of DACs resort to using a linear driver stage (e.g., an amplifier) to boost the operating current and voltage. However, linear amplification of current and voltage with AC components that extend out to 2 MHz is difficult and inefficient. Designers of the linear amplifiers make tradeoffs that harm distortion, drive level, or frequency response because of the device limitations and cost constraints. It is possible to achieve low distortion, but the cost in power consumption is very high. Efficiency on the order of 10% is common with these linear techniques.

SUMMARY OF THE PRESENT INVENTION

The digital-to-analog converter of the present invention eliminates the need for a linear amplification stage, and provides a simple and efficient conversion out to the 2 MHz range. Unlike conventional DACs that require converting the digital data to a current and then converting the current to an output voltage or require performing a current steering operation, the DAC of the present invention directly converts the digital data to an output voltage.

In a preferred embodiment, control signals representing the digital data are supplied to respective converting elements. Each converting element or converter selectively applies a voltage to an output line in response to the respectively received control signal. More specifically, the converter includes a switch that selectively connects the output line via a resistor to a voltage line having a predetermined voltage.

Furthermore, in the preferred embodiment, signal dependent error between adjacent samples, which shows up as harmonic distortion in the analog output signal, is eliminated. The preferred embodiment of the DAC according to the present invention includes reset circuitry that applies a zero value digital signal, preferably at the switches that selectively connect the output line via a resistor to a voltage line having a predetermined voltage. This zero value signal has the effect of adjusting the analog output signal to a reset voltage level between samples. This eliminates the above-mentioned harmonic distortion.

The system for performing digital-to-analog conversion, which includes the DAC of the present invention, also allows reduction in the number of bits representing a sample. In the system according to the present invention, the noise in the digital data is shifted to the upper frequency range, away from the desired frequency spectrum, and then filtered out from the analog output. Because of this noise shaping and filtering, fewer bits are required to obtain the same signal-to-noise ratio as compared to a lack of noise shaping and filtering.

BRIEF DESCRIPTION OF THE DRAWINGS

The present invention will become more fully understood from the detailed description given herein below and the accompanying drawings which are given by way of illustration only, wherein like reference numerals designate corresponding parts in the various drawings, and wherein.

DETAILED DESCRIPTION OF THE PREFERRED EMBODIMENTS

Figure 1:
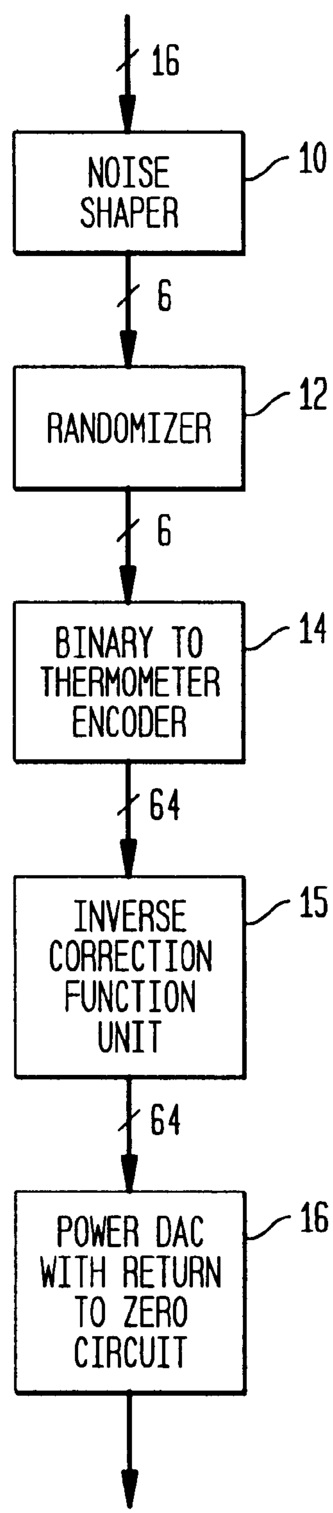
FIG. 1 illustrates the system for performing digital-to-analog conversion according to an embodiment of the present invention that includes the digital-to-analog converter (DAC) according to the present invention.

FIG. 1 illustrates the system for performing digital-to-analog conversion according to an embodiment of the present invention that includes the digital-to-analog converter (DAC) according to the present invention. As shown in FIG. 1, a quantization noise shaper 10 receives digital data, 16 bits for the purposes of example only. The quantization noise shaper 10 shifts a portion of the quantization noise that would otherwise be equally spread across the frequency spectrum represented by the digital data into the upper frequencies of the frequency spectrum in the well-known manner, and produces a noise shifted output representing the digital data. For the purposes of example only, the output of the noise shaper 10 is 6 bits.

Because, as explained below, the upper frequencies will be filtered out from the generated analog signal, fewer bits can be used by the noise shaper 10 to achieve the same signal-to-noise ratio as compared to if no noise shaping and filtering was performed.

A randomizer 12 receives the output of the noise shaper 10, and randomizes the output in the well-known manner. Briefly, the randomizer 12 removes the behavior that results from small differences between switches 60 and 61 (described in detail below with respect to FIG. 2) in converters 56 and 57, respectively. Variation in these circuits results in a distortion pattern that is a strong function of the above mentioned circuit differences. Because it is not possible to remove variation between these circuits to an acceptable level, the randomizer 12 transforms the circuit difference pattern dependent distortion into random noise. The randomizer 12 essentially spreads the spectrum of harmonic products over the entire band of interest. This effect is much preferred to the larger, yet narrowband, distortion products that would occur without the randomizer 12.

A binary to thermometer encoder 14 encodes the output of the randomizer 12 into control signals. In the preferred embodiment, the 6 bits of data output from the randomizer 12 are encoded into 64 control signals. Because the operation of thermometer encoders is so well-known, this process will not be described for the sake of brevity.

Figure 4A:
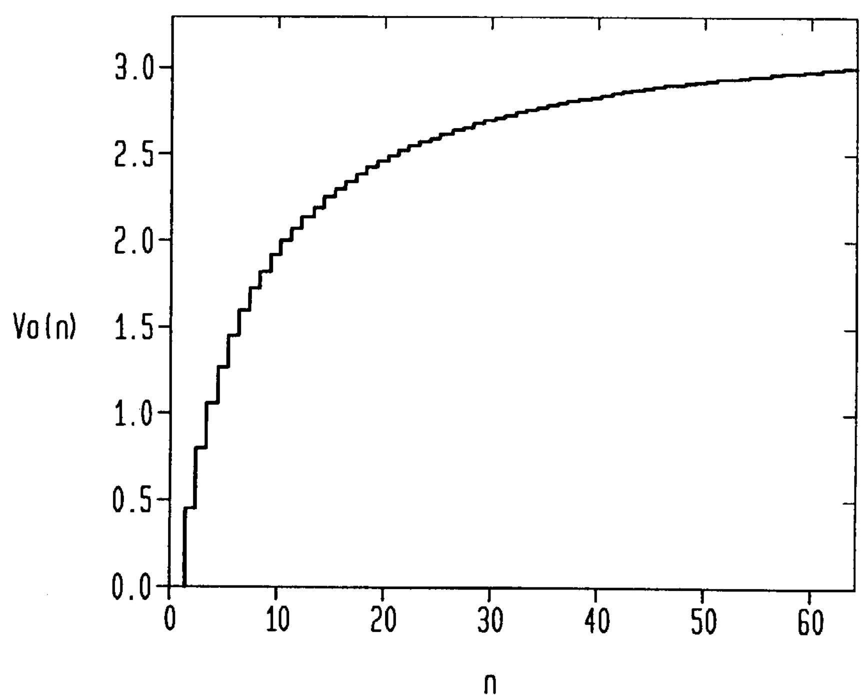
FIG. 4A illustrates an example of the uncorrected linear output function of the DAC.
Figure 4B:
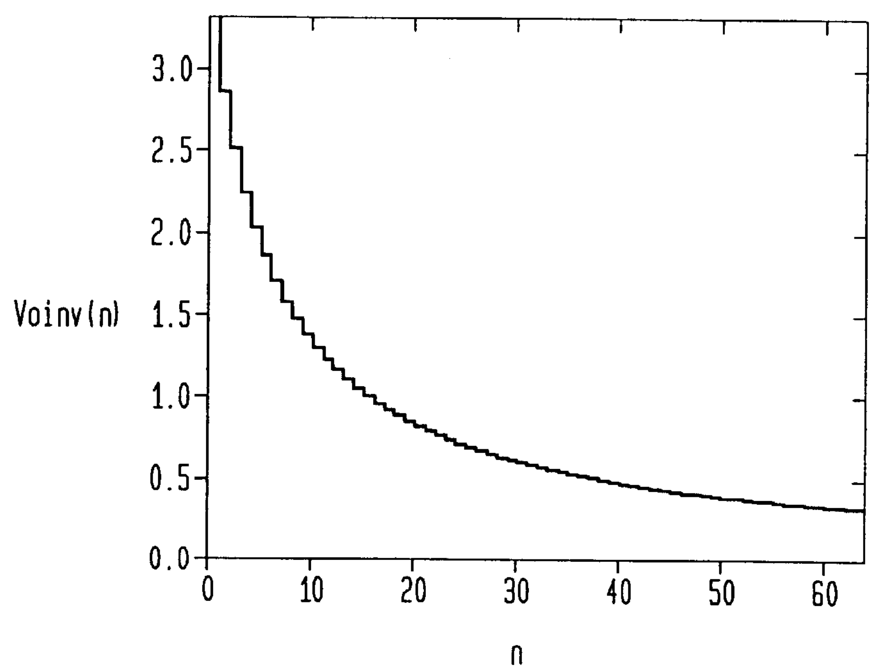
FIG. 4B illustrates an example of the correction function employed by the inverse correction function unit in FIG. 1.
Figure 4C:
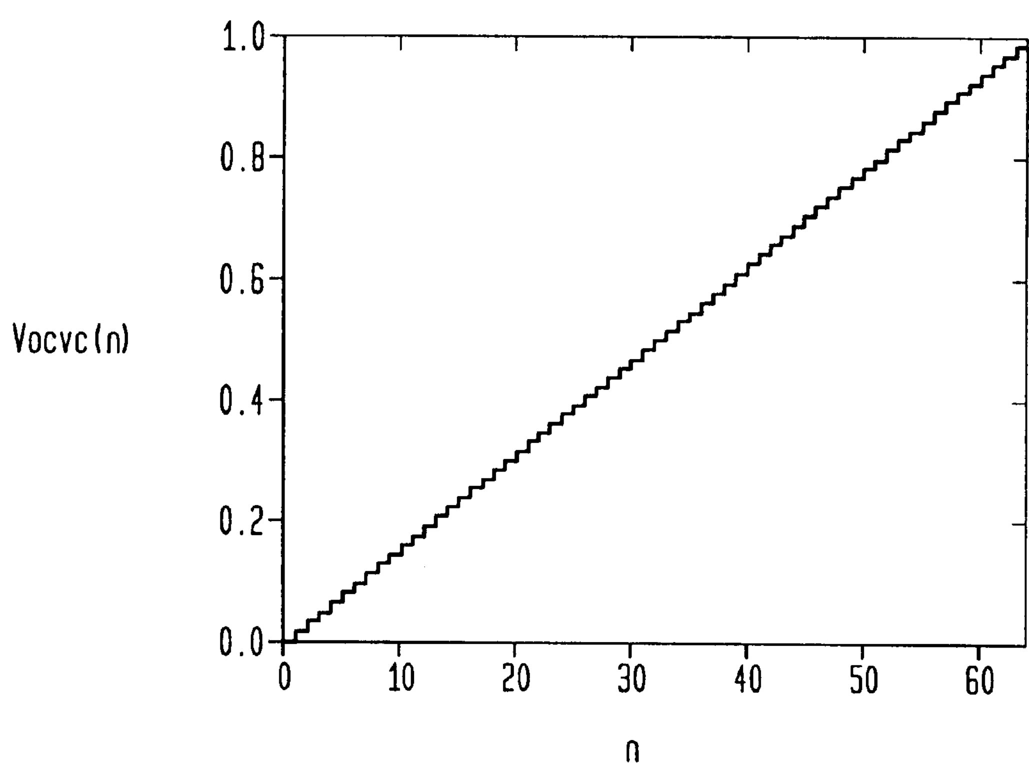
FIG. 4C illustrates an example of the corrected linear output function of the DAC.

An inverse correction function unit 15 applies a correction function to the control signals, and outputs the resulting control signals to a DAC 16. In the absence of the inverse correction function unit 15, the DAC 16 input/output transfer function that is non-linear as illustrated, for example, in FIG. 4A. Specifically, FIG. 4A illustrates an example of the output voltage of the DAC 16 versus the number n of converters 56 (described in detail below with respect to FIG. 2) in one of the converting structures 50 and 52. For the example given in FIG. 4A, FIG. 4B illustrates the correction function employed by the inverse correction function unit 15, and FIG. 4C illustrates an example of the corrected linear output function of the DAC 16 when the inverse correction function unit 15 is present.

As stated above, the DAC 16 receives the control signals, which represent the digital data, and converts the represented digital data into an analog control signal. The structure and operation of the DAC 16 will be described with respect to FIG. 2.

Figure 2:
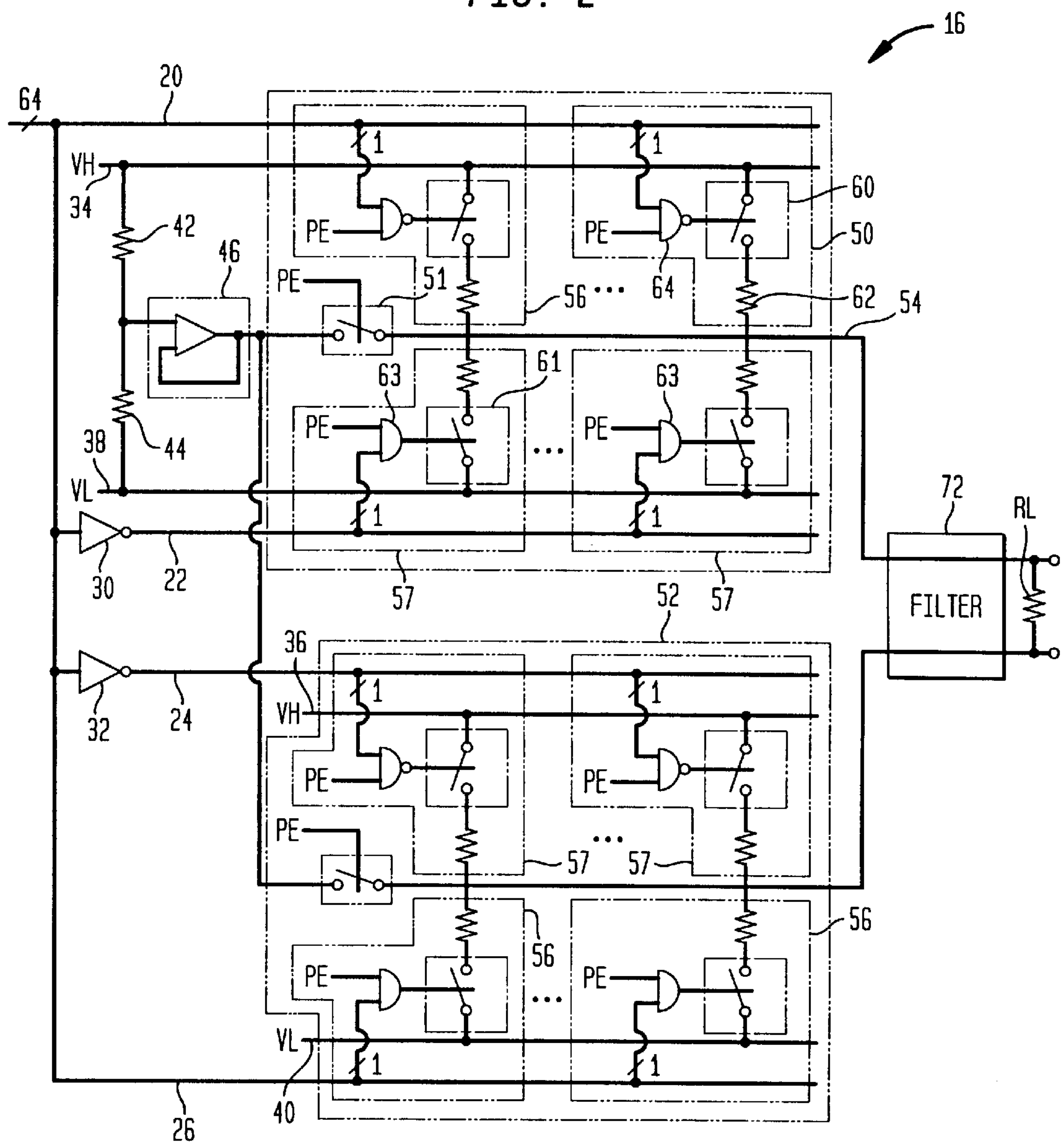
FIG. 2 illustrates the digital-to-analog converter according to an embodiment of the present invention in detail.

FIG. 2 illustrates the DAC 16 according to an embodiment of the present invention. As shown, the 64 control signals are supplied to a first control signal line 20, a second control signal line 22, a third control signal line 24 and a fourth control signal line 26. First and second inverters 30 and 32 invert the control signals on the second and third control signal lines 22 and 24, respectively. The DAC 16 further includes first and second high voltage lines 34 and 36 and first and second low voltage lines 38 and 40. The first and second high voltage lines 34 and 36 carry the same high voltage VH (e.g., 3V) supplied by a power supply (not shown), while the first and second low voltage lines carry the same low voltage VL (e.g., ØV). First and second resistors 42 and 44 are connected in series between the first high and low voltage lines 34 and 38, and a differential amplifier 46 is connected to the common node of the first and second resistors 42 and 44.

A first converting structure 50 is connected to the first and second control signal lines 20 and 22, the first high and low voltage lines 34 and 38, and the output of the differential amplifier 46. The first converting structure 50 includes a main switch 51 connected between the output of the differential amplifier 46 and a first output line 54. The main switch 51 selectively connects the output of the differential amplifier 46 with the first output line 54. One converter 56 for each control signal on the first control signal line 20 is connected between the first control signal line 20 and the first output line 54. Accordingly, in the preferred embodiment, 64 converters 56 are connected between the first control signal line 20 and the first output line 54, and each converter 56 receives a different one of the 64 control signals on the first control signal line 20. Similarly, one converter 57 for each inverted control signal on the second control signal line 22 is connected between the second control signal line 22 and the first output line 54. Accordingly, in the preferred embodiment, 64 converters 57 are connected between the second control signal line 22 and the first output line 54, and each converter 57 receives a different one of the 64 inverted control signals on the second control signal line 22.

As shown, the converters 56 each have the same structure, and include a switch 60, which is a PMOS transistor, connected in series with a resistor 62 between the first high voltage line 34 and the first output line 54. The operation of the switch 60 is controlled by the output of a NAND gate 64. The NAND gate 64 receives an enable signal PE and a respective one of the control signals on the first control signal line 20 as inputs.

Similarly, the converters 57 have the same structure, and include a switch 61, which is an NMOS transistor, connected in series with the resistor 62 between the first low voltage line 38 and the first output line 54. The operation of the switch 61 is controlled by the output of an AND gate 63. The AND gate 63 receives the enable signal PE and a respective one of the inverse control signals on the second control signal line 22 as inputs. It should be understood that the resistance of the resistor 62 in each of the converters 56 and 57 is the same, and the switches 60 and 61 are not limited to being PMOS and NMOS transistors, respectively. Furthermore, the resistance of the first and second resistors 42 and 44 is preferably the same as the resistor 62.

As shown in FIG. 2, the DAC 16 further includes a second converting structure 52. The second converting structure 52 has the same structure as the first converting structure 50 except that (1) the main switch 42 is connected between a second output line 70 and the differential amplifier 46, and (2) the second converting structure 52 is connected to the to the third and fourth control signal lines 24 and 26, the second high and low voltage lines 36 and 40 and the output of the differential amplifier 46 in the same manner that the first converting structure 50 was connected to the second and first control signal lines 22 and 20, the first low and high voltage lines 38 and 34, and the output of the differential amplifier 46. Consequently, the second converting structure 52 will not be described in detail.

A passive filter 72 filters out the upper frequencies in the frequency spectrum of the analog signal on the first and second output lines 54 and 72. In FIG. 2, a load resistor RL is shown connected between the first and second output lines 54 and 70 at the output of the filter 72. The load resistor RL represents the load driven by the DAC 16. For example, when applied to an ADSL modem, the load is 10 Ohms.

Next, the operation of the DAC 16 illustrated in FIG. 2 will be described. When the enable signal PE is logic high, the main switch 51 in the first and second converting structures 50 and 52 is open such that the first and second output lines 54 and 70 are not connected to the output of the differential amplifier 46. Also, the switches 60 and 61 respectively in each of the converters 56 and 57 will operate based on the respective control signal received by the NAND gate 64 and the AND gate 63.

Namely, when the control signal received by the NAND gate 64 is high, the switch 60 is closed, and when the control signal received by the NAND gate 64 is low, the switch 60 is open. For example, for the first converter 56 above the first output line 54, if the first control signal on the first control signal line 20 is logic high, the switch 60 closes so that the first output line 54 is connected via the switch 60 and the resistor 62 to the first high voltage line 34.

Similarly, when the inverse control signal received by the AND gate 63 is high, the switch 61 is closed, and when the control signal received by the AND gate 63 is low, the switch 61 is open. For example, for the first converter 57 below the first output line 54, if the first control signal on the first control signal line 20 is logic low, the switch 61 closes so that the first output line 54 is connected via the switch 61 and the resistor 62 to the first low voltage line 38.

Depending on the control signals, a voltage representative of the digital data will appear on both the first and second output lines 54 and 70. Because the second control structure 52 is connected to high and low voltage lines, and is connected to control signal and inverse control signal lines in a manner which is the inverse of the manner in which the first control structure 50 is connected, the voltage placed on the second output line 70 with respect to ground is the opposite of the voltage placed on the first output line 54 with respect to ground. As a result, the voltage across the first and second output lines 54 and 70 is double that placed on, for example, the first output line 54 alone, with respect to ground. As will be appreciated by one skilled in the art from this disclosure, the DAC 16 of FIG. 2 includes delays (not shown for the purpose of clarity) to substantially synchronize the operation of the converters 56 above and below the first and second output lines 54 and 70.

The filter 72 is a conventional low pass filter and filters out the upper frequencies into which the noise was shifted. The filter 72 also filters out noise in the output of the first and second output lines 54 and 70 caused by the power supply and/or supplies supplying the high and/or low voltages on the high and low voltage lines. For example, an inductor input low pass filter would decouple the transmission line at high frequencies above the band of interest, additionally, a capacitor input high pass filter would decouple the transmission line at frequencies below the band of interest.

As will be appreciated from the above and following disclosure, the NAND gates 64 in the converters 56, the AND gates 63 in the converters 57, the main switches 52 in the first and second converting structures 50 and 52, the differential amplifier 46 and the first and second resistors 42 and 44 cooperatively form a reset circuit. And, as will be further appreciated, the reset circuit is optional, albeit preferred, and does not require the presence of the differential amplifier 46 and the first and second resistors 42 and 44 to function properly.

When the reset circuit is not present, the control signals (without inversion) are directly connected to and control the operation of the switches 60 and 61, and the main switches 51 in the first and second converting structures 50 and 52, the differential amplifier 46 and the first and second resistors 42 and 44 can be eliminated. In this non-reset circuit embodiment, operation is as described above wherein the enable signal was described as being logic high.

Figure 3A:
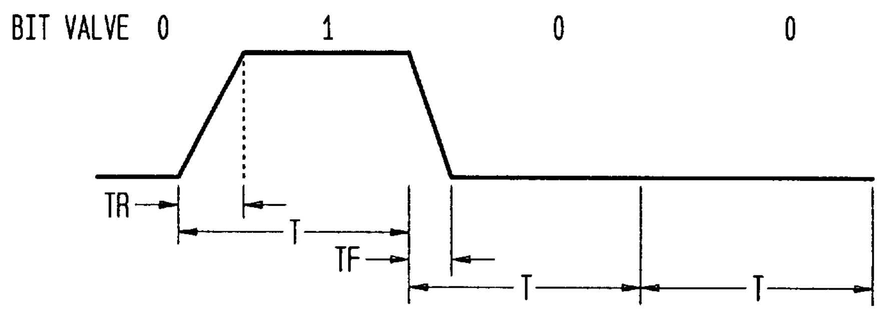
FIG. 3A illustrates the waveform of the analog signal output by the digital-to-analog converter (DAC) of the present invention when the DAC does not include the reset circuit.

In the absence of the reset circuit, the analog signal appearing across the load resistor RL is as shown in FIG. 3A. As shown, T represents one sample period, and Tr and Tf represent the waveform rise and fall times. The finite rise time reduces the average value of the 1 sample because the waveform is not at the 1 level for the full sample period T. The 0 sample to the right of the first 1 sample is also impacted. The finite fall time results in the 0 sample having a larger average value than the 0 to its right because of the time spent transitioning from the 1 to the 0 levels.

Figure 3B:
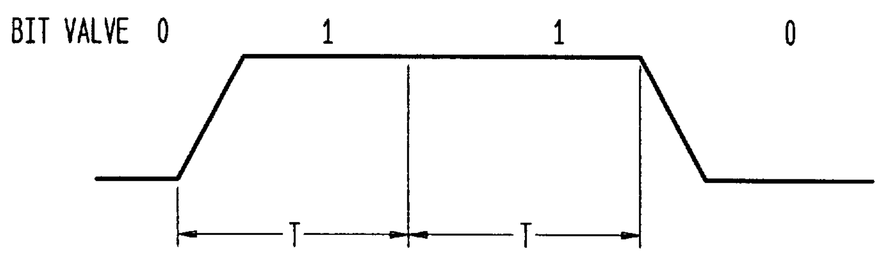
FIG. 3B illustrates the impact of the consecutive is on the waveform of the analog signal output by the DAC of the present invention when the DAC does not include the reset circuit.

FIG. 3B shows that consecutive 1s are also impacted by the finite rise and fall times. The average level for the second 1 sample is larger than that of the first 1 sample because the second 1 sample is at the full 1 level for the entire sample period T. The signal dependent interference between adjacent samples shows up as harmonic distortion in the analog signal.

Figure 3C:
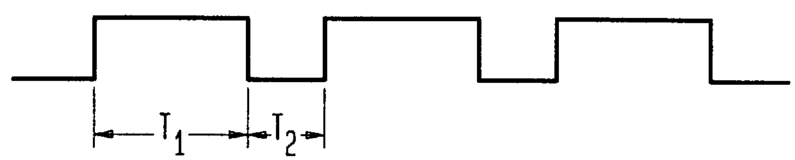
FIG. 3C illustrates the waveform of the enable signal PE.

In the preferred embodiment of the present invention shown in FIG. 2, the reset circuit eliminates these problems. As shown, in FIG. 3C, during the sample period T, the enable signal PE is at logic high for a first period T1 and then logic low for a second period T2, which is greater than the fall time Tf. The description above regarding FIG. 2 explains the operation of the DAC 16 in FIG. 2 when the enable signal PE is logic high. Now, the operation of the DAC 16 when the enable signal PE is logic low will be described.

When the enable signal PE is logic low, the output of the NAND gates 64 is high, and the switches 60 open. Also, the output of the AND gate 63 is low, and the switches 61 open. As a result, neither of the first high voltage line 34 and the first low voltage 38 can be connected to the first output line 54, and neither of the second high voltage line 36 and the second low voltage line 40 can be connected to the second output line 70. Also, the main switches 51 in the first and second converting structures 54 and 70 close. As a result, the first and second output lines 54 and 70 are connected to the output of the differential amplifier 46. Because the first and second resistors 42 and 44 have the same resistance, the first and second output lines 54 and 70 achieve the same voltage that is the average of the high voltage (on the first and second high voltage lines 34 and 36) and the low voltage (on the first and second low voltage lines 38 and 40). The differential amplifier 46 serves to stabilize this voltage.

Figure 3D:
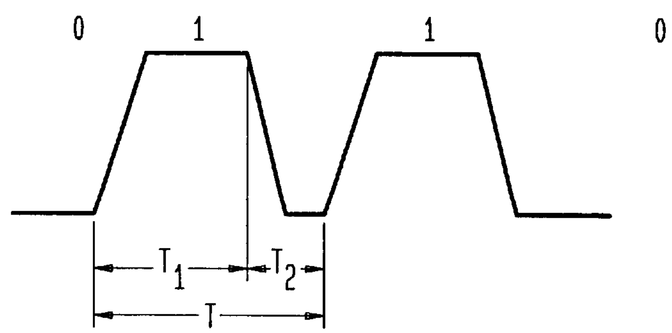
FIG. 3D illustrates the waveform of the analog signal output by the DAC of the present invention when the DAC includes the reset circuit.

Consequently, as illustrated in FIG. 3D, during the first period of time T1, the waveform for the first 1 sample rises to the 1 sample level, and beginning at the second period of time T2, the waveform falls. Because the second period T2 is greater than the fall time Tf, the waveform reaches zero volts. Because the voltages on the first and second output lines 54 and 70 are the same, the voltage across the load resistor RL is zero. Then, at the beginning of the symbol period for the next sample 1, the rise and fall of the waveform repeats. As will be appreciated, the waveform returns to zero volts such that each 1 sample and also each 0 sample have the same average level. As should be appreciated, each 0 samples will have the same average level. This eliminates signal dependent interference between adjacent samples.

As explained above, the DAC according to the present invention directly connects a voltage to the analog output line such that no current-to-voltage or current steering operation as in the conventional art is required. This greatly simplifies the conversion process, and reduces the amount of needed chip space because amplification of the analog output is no longer required to drive the desired load. Furthermore, the optional addition of the reset circuit provides the further benefit of eliminating signal dependent interference between adjacent samples.

The invention being thus described, it will be obvious that the same may be varied in many ways. Such variations are not to be regarded as a departure from the spirit and scope of the invention, and all such modifications are intended to be included within the scope of the following claims.

We claim:

1. A digital-to-analog converter, comprising:

an output line;

a plurality of converters receiving control signals representative of digital data, each converter selectively applying a voltage to the output line in response to a respective one of the control signals, each converter performing the selective application operation without performing a current-to-voltage conversion.

2. The converter of claim 1, further comprising:

reset circuitry for periodically preventing the converters from applying the voltage to the output line.

3. The converter of claim 2, wherein the reset circuitry applies a reset voltage to the output line when preventing the converters from applying the voltage to the output line.

4. The converter of claim 1, further comprising:

reset circuitry for periodically resetting the voltage on the output line to a reset voltage.

5. A digital-to-analog converter, comprising:

an output line;

a plurality of converters receiving control signals representative of digital data, each converter selectively applying a voltage to the output line in response to a respective one of the control signals, each converter performing the selective application operation without performing a current steering operation.

6. The converter of claim 5, further comprising:

reset circuitry for periodically preventing the converters from applying the voltage to the output line.

7. The converter of claim 6, wherein the reset circuitry applies a reset voltage to the output line when preventing the converters from applying the voltage to the output line.

8. The converter of claim 5, further comprising:

reset circuitry for periodically resetting the voltage on the output line to a reset voltage.

9. A digital-to-analog converter, comprising:

an output line; and a first plurality of converters receiving a plurality of control signals, the plurality of control signals representing digital data, each converter selectively connecting the output line to a voltage in response to a respective one of the plurality of control signals to directly convert the digital data to a corresponding voltage without performing a current-to-voltage conversion.

10. The converter of claim 9, wherein each converter comprises:

a series connection of a switch and a resistor.

11. The converter of claim 10, further comprising:

a first voltage line having a first predetermined voltage, wherein each converter is connected between said first voltage line and said output line.

12. A digital-to-analog converter, comprising:

an output line;

a first plurality of converters receiving control signals representative of digital data, each converter selectively connecting the output line to a voltage in response to a respective one of the control signals, a first voltage line having a first predetermined voltage, wherein each converter is connected between said first voltage line and said output line and directly converts the digital data, as represented by said control signals, to corresponding first predetermined voltages on said first voltage line;

a second voltage line having a second predetermined voltage different from the first predetermined voltage; and a second plurality of converters receiving an inverse of the control signals, each of said second plurality of converters connected between said second voltage line and said output line, and selectively connecting the output line with the second voltage line in response to a respective one of the inverse control signals, directly converting the digital data, as represented by said inverse control signals, to corresponding second predetermined voltages on said second voltage line.

13. The converter of claim 11, wherein the switch in each converter opens and closes in response to the respectively received one of the control signals.

14. The converter of claim 11, wherein the switch in each converter opens and closes in response to the respectively received one of the control signals and an enable signal, the enable signal causing the switch in each converter to open so that the output line is periodically disconnected from the first voltage line.

15. The converter of claim 14, further comprising:

an output line switch selectively connecting the output line to a reset voltage in response to the enable signal, said output line switch connecting the output line to the reset voltage when the switch in each converter opens in response to the enable signal.

16. The converter of claim 9, further comprising:

reset circuitry for periodically preventing the converters from connecting the voltage to the output line.

17. The converter of claim 16, wherein the reset circuitry applies a reset voltage to the output line when preventing the converters from connecting the voltage to the output line.

18. The converter of claim 9, further comprising:

reset circuitry for periodically resetting the voltage on the output line to a reset voltage.

19. The converter of claim 9, further comprising:

a filter filtering an analog signal on the output line.

20. A system for performing digital-to-analog conversion, comprising:

a quantization noise shaper receiving digital data, shifting quantization noise in the digital data to an upper frequency range, and outputting noise shifted digital data;

a randomizer randomizing the noise shifted digital data;

an encoder converting the noise shifted digital data to control signals;

a digital-to-analog converter including, an output line, and a first plurality of converters receiving the control signals, each converter selectively connecting the output line to a voltage in response to a respective one of the control signals to directly convert the digital data to a corresponding voltage without performing a current-to-voltage conversion; and a correction circuit, connected between the encoder and the digital-to-analog converter, correcting non-linearity in output from the digital-to-analog converter.

21. The system of claim 20, wherein the digital-to-analog converter further comprises:

a filter filtering out the upper frequency range from an analog signal on the output line.

22. A system for performing digital-to-analog conversion, comprising:

a digital-to-analog converter including, an output line, and a first plurality of converters receiving control signals representing digital data, each converter selectively connecting the output line to a voltage in response to a respective one of the control signals to directly convert the digital data to a corresponding voltage without performing a current-to-voltage conversion; and a correction circuit, connected to the digital-to-analog converter, correcting non-linearity in voltages output from the digital-to-analog converter.

23. The system of claim 22, wherein the correction circuit is connected to an input side of the digital-to-analog converter.

* * * * *